United States Patent [19]

Pelley, III et al.

[11] Patent Number: 4,791,615
[45] Date of Patent: Dec. 13, 1988

[54] MEMORY WITH REDUNDANCY AND PREDECODED SIGNALS

[75] Inventors: Perry H. Pelley, III, Austin; Bruce L. Morton, Round Rock, both of Tex.

[73] Assignee: Motorola, Inc., Schaumburg, Ill.

[21] Appl. No.: 944,099

[22] Filed: Dec. 22, 1986

[51] Int. Cl.$^4$ .............................................. G11C 11/40
[52] U.S. Cl. .................................... 365/200; 365/189; 365/210
[58] Field of Search ................ 365/189, 230, 200, 210

[56] References Cited

U.S. PATENT DOCUMENTS 4,701,884  10/1987  Aoki et al. .
4,720,817   1/1988  Childers ............................. 365/200

Primary Examiner—Terrell W. Fears
Attorney, Agent, or Firm—John A. Fisher; Jeffrey Van Myers; James L. Clingan, Jr.

[57] ABSTRACT

A memory has an address buffer which receives a row address and a column address and outputs these buffered address signals to a predecoder. A row decoder and column decoder use predecoded signals provided by the predecoder to select a row and a column from a main array. A redundant row is provided to replace a defective row from the main array. A programmable redundant decoder is programmable to select the redundant row in response to the predecoder signals which select the defective row.

14 Claims, 4 Drawing Sheets

MEMORY WITH REDUNDANCY AND PREDECODED SIGNALS

FIELD OF THE INVENTION

The present invention relates to memories, and more particularly, to memories which have redundancy and use predecoded signals.

BACKGROUND OF THE INVENTION

A common feature of present memories is redundancy. A row or column which is tested to be defective is replaced by a redundant row or column. The replacement is implemented by blowing a fusible link. This can be done using either electrical or laser techniques. Both of these techniques are well known. One of the desirable features of redundancy is that there be no sacrifice in access time due to the redundancy. One approach is to ensure that the access time to an implemented row or column is at least as fast as that for an access from a location in memory in which both the row and column are part of the main array. This approach may result in the memory not being designed for maximum speed for the main array. The benefits of the redundancy can be greater than the increase in speed for optimized main array access. Another desirable feature of redundancy is that the fusible link should only be be blown when there is a need for a redundant element. If there are no defective rows or columns, there should be no requirement to blow a fusible link.

Another problem associated with redundancy is having a large power spike at power-up. This can happen because there is current that is drained through the fusible links to determine the extent if any to which redundancy is to be implemented. There may be a number of determinations which are required to be made. One determination that is normally made is whether or not there is any redundancy implemented. This is done separately for columns and rows. It may also be done for each sub-array of the memory. Also there may be this same type of determination with respect to each redundant row and column. All of these determinations need to be made so as to not slow down the access time of the memory. Consequently, this determination has generally been done at power-up of the memory which increases the power spike at power-up.

A characteristic of many memories is the presence of predecoders. An advantage of predecoders is that there are fewer decoders attached to the lines which carry the predecoded signals. Additionally the row and column decoders which receive the predecoded signals require fewer transistors than would be required if normal address signals are received. There have been several problems with implementing redundancy in which predecoding is used. One of the problems relates to ensuring that there is no speed loss when a redundant row or column is implemented. This has been achieved by having special decoders for the redundant element which receive the output of the address buffers directly. This allows the decoder associated with the redundant element to receive the addresses for decoding before the decoders associated with the normal array receive the predecoded signal. The time then associated with potential delays in the redundancy implementation circuitry is compensated for by having the redundant decoder receive the address signals before the normal decoder for the main array does.

SUMMARY OF THE INVENTION

An object of the present invention is to provide an improved memory which has redundancy and predecoding.

Another object of the invention is to provide a memory with improved redundancy using predecoded signals.

Yet another object of the invention is to provide a memory using predecoding and redundancy with improved power-up characteristic.

These and other objects are achieved in an memory which has a main array of first-type lines of memory cells and second-type lines of memory cells. The first-type lines intersect said second-type lines with memory cells located at said intersections. A memory cell is selected by selecting a first-type line and a second type-line. The memory has a buffer circuit, a predecoder circuit, a first normal decoder, a redundant first-type line, and a programmable redundant decoder circuit. The buffer circuit receives a first address for providing information for selecting a first-type line and a second address for providing information for selecting a second-type line. The predecoder circuit, which is coupled to the buffer circuit, performs a predecode on the first address and provides predecode signals representative of this predecode. The first normal decoder circuit, which is coupled to the predecoder circuit, selects a first-type line from the main array in response to the predecode signals. The redundant first-type line is for replacing a defective first-type line in the main array. The programmable redundant decoder circuit, which is coupled to the output of the predecoder means, is for being programmed to select the redundant first-type line in response to the predecoder signals which select the defective first-type line.

DESCRIPTION OF THE INVENTION

Figure 1:
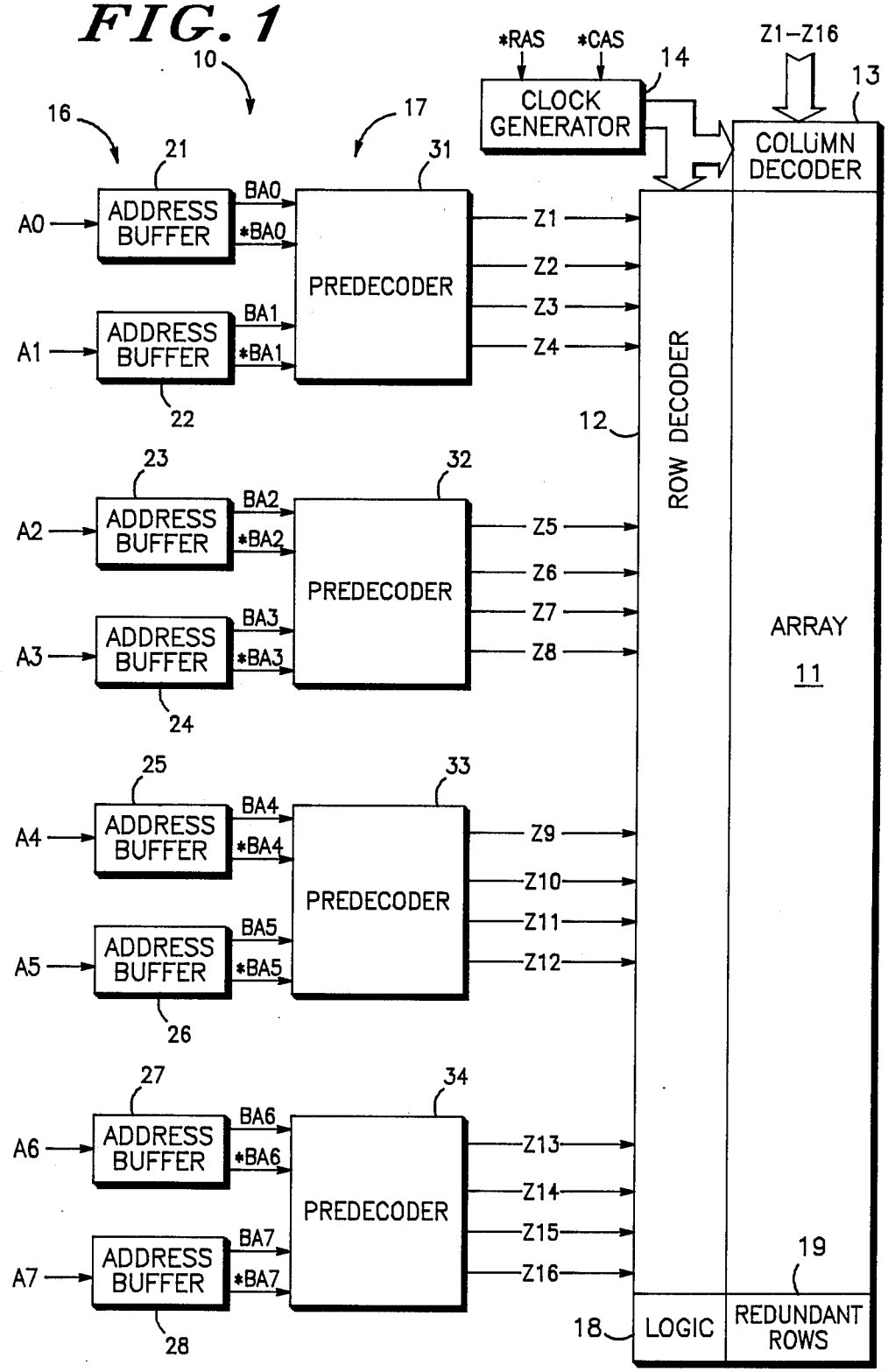
FIG. 1 is a block diagram of a memory according to a preferred embodiment of the invention.

Shown in FIG. 1 is dynamic random access memory (DRAM) 10 comprised generally of an array 11 of memory cells, a row decoder 12, a column decoder 13, a clock generator 14, a plurality of address buffers 16, a plurality of predecoders 17, a redundancy logic circuit 18, and a plurality of redundant rows 19. Plurality of address buffers 16 comprises an address buffer 21, an address buffer 22, an address buffer 23, an address buffer 24, an address buffer 25, an address buffer 26, an address buffer 27, and an address buffer 28. Plurality of predecoders 17 comprises a predecoder 31, a predecoder 32, a predecoder 33, and a predecoder 34. Array 11 is comprised of memory cells located at intersections of rows and columns. Plurality of redundant rows 19 has rows which are the same as that of array 11. These redundant rows 19 have the same number of memory cells as that of a row in array 11.

Address buffers 16 receive externally provided address signals A0, A1, A2, A3, A4, A5, A6, and A7 and provide buffered complementary signals in response thereto. Address buffer 21 receives address signal A0 and provides complementary buffered address signals BA0 and *BA0. Address buffer 22 receives address signal A1 and provides complementary buffered address signals BA1 and *BA1. Address buffer 23 receives address signal A2 and provides complementary buffered address signals BA2 and *BA2. Address buffer 24 receives address signal A3 and provides complementary buffered address signals BA3 and *BA3. Address buffer 25 receives address signal A4 and provides complementary buffered address signals BA4 and *BA4. Address buffer 26 receives address signal A5 and provides complementary buffered address signals BA5 and *BA5. Address buffer 27 receives address signal A6 and provides complementary buffered address signals BA6 and *BA6. Address buffer 28 receives address signal A7 and provides complementary buffered address signals BA7 and *BA7. Predecoders 17 receive the outputs of address buffers 16.

Predecoder 31 receives signals BA0, *BA0, BA1, and *BA1 and provides predecoded signals Z1, Z2, Z3, and Z4 in response thereto. Predecoder 32 receives signals BA2, *BA2, BA3, and *BA3 and provides predecoded signals Z5, Z6, Z7, and Z8 in response thereto. Predecoder 33 receives signals BA4, *BA4, BA5, and *BA5 and provides predecoded signals Z9, Z10, Z11, and Z12 in response thereto. Predecoder 34 receives signals BA6, *BA6, BA7, and *BA7 and provides predecoded signals Z13, Z14, Z15, and Z16 in response thereto. For any given logic combination of the address signals received, the precoder associated with those address signals will provide one of its output signals in an active state. The active state is normally a logic high for a signal. A signal which is designated with an asterisk (*) indicates that that signal is active at a logic low. For any given logic combination of signals A0 and A1, one of signals Z1, Z2, Z3, or Z4 becomes active. For any given logic combination of signals A2 and A3, one of signals Z5, Z6, Z7, or Z8 becomes active. For any given logic combination of signals A4 and A5, one of signals Z9, Z10, Z11, or Z12 becomes active. For any given logic combination of signals A6 and A7, one of signals Z13, Z14, Z15, or Z16 becomes active.

Row decoder 12 receives predecoded signals Z1-Z16 and uses these signals to select a row. Associated with each row is a logic decoder. Each of these logic decoders receives one predecoded signal output from of each of precoders 31-34. In this manner there are 256 possible combinations of precoder signals Z1-Z16. There are 256 logic deocders in which each receives a unique combination of predecoded signals Z1-Z16. Each predecoded signal Z1-Z16 is received by one fourth of these 256 logic decoders. This is conventional predecoder operation.

Memory 10 is a DRAM in which the column and row address is multiplexed. A DRAM such as memory 10 has a data cycle in which data is either read from or written into array 11. The data cycle has two portions, an active cycle and a precharge cycle. The active cycle begins when externally provided signal *RAS becomes active by switching to a logic low. An output from array 11 will not be provided until after externally provided signal *CAS also becomes active. Clock generator 14 receives signals *RAS and *CAS and provides numerous clock signals. The beginning of the precharge cycle occurs when signals *RAS and *CAS become inactive by switching to a logic high. Column decoder 13 also receives predecoded signals Z1-Z16 for selecting a column. The timing of when row decoder 12 is responsive to the outputs of predecoders 17 and column decoder is responsive to the outputs of predecoders 17 is controlled by clock generator 14. This is conventional operation for a DRAM.

Redundancy logic circuit 18 is provided for selecting one or more of redundant rows 18 in the event there are one or more defective rows in array 11. Logic circuit 18 receives all of predecoded signals Z1-Z16. Logic circuit 18 is programmable so that each redundant row of rows 19 is selectable in much the same manner as a row in array 11. Logic circuit 18 comprises a plurality of individual programmable logic circuits, one for each redundant row.

Figure 2:
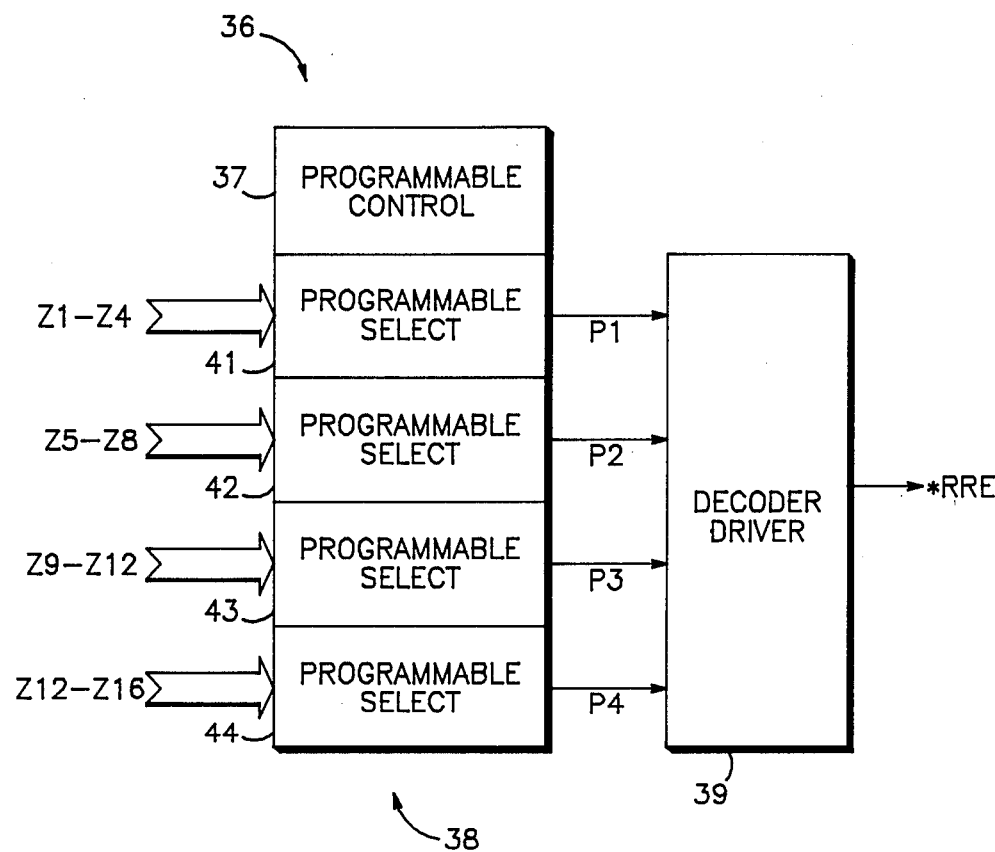
FIG. 2 a block diagram of a portion of the memory of FIG. 1 according to a preferred embodiment of the invention.

Shown in FIG. 2 is an individual programmable logic circuit 36 comprised generally of a programmable control circuit 37, plurality of programmable select circuits 38, and a decoder/driver circuit 39. Individual programmable logic circuit 36 is one of a plurality of such circuits of redundancy logic circuit 18. Plurality of programmable select circuits 38 comprise a programmable select circuit 41, a programmable select circuit 42, a programmable select circuit 43, and a programmable select circuit 44. Each of programmable select circuits 38 receive four of the predecoder signals Z1-Z16 and, under the control of programmable circuit 37, provide an output in response thereto. There is a redundant row of redundant rows 19 associated with programmable select circuit 36. If memory 10 is determined to have a defective row in array 11, programmable circuit 36 can be programmed so that the redundant row associated therewith can replace the defective row. If such a replacement is to be made, circuit 36 will be programmed so that circuit 36 will provide a redundant row enable signal for selecting the row associated with circuit 36 in response to the same combination of predecoder signals Z1-Z16 that would normally select the defective row. The defective row would then be made inactive by any conventional means. Programmable select circuit 41 has an output for providing a signal P1. Programmable select circuit 42 has an output for providing a signal P2. Programmable select circuit 43 has an output for providing a signal P3. Programmable select circuit 44 has an output for providing a signal P4. Decoder/driver 39 receives signals P1-P4 and provides signal *RRE in an active state when all of signals P1-P4 are active. In the case in which the redundant row associated with individual redundancy logic circuit 18 does not replace any row in array 11, programmable control circuit 37 forces all of signals P1-P4 to an inactive state at a logic low.

Figure 3:
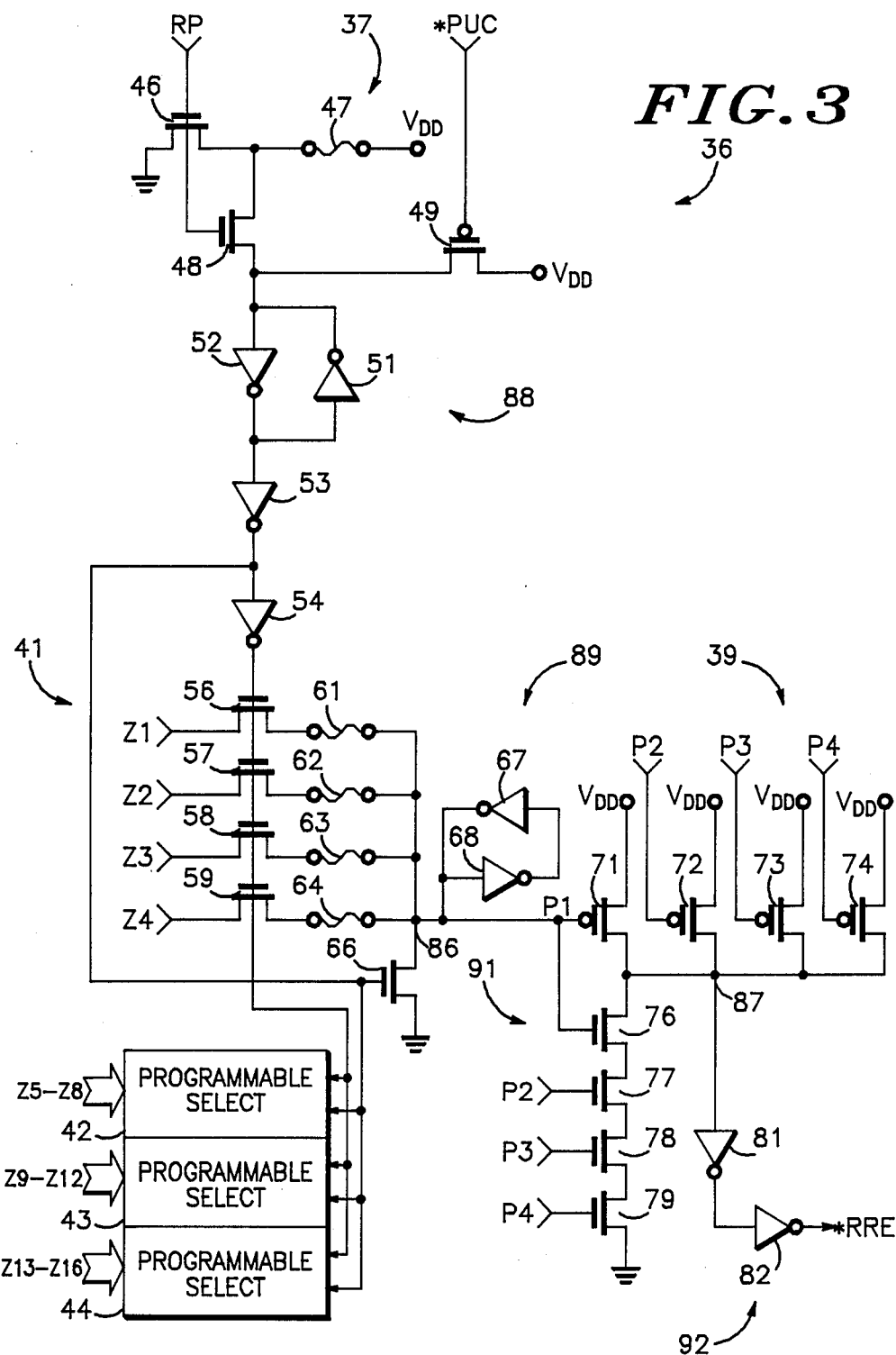
FIG. 3 is a circuit diagram of a portion of the block diagram of FIG. 2 according to a preferred embodiment of the invention.

Shown in FIG. 3 is individual logic circuit 36 in which programmable select circuit 41, programmable control circuit 37, and decoder/driver 39 are shown in circuit diagram form. Control circuit 37 comprises an N channel transistor 46, fusible link 47, an N channel transistor 48, a P channel transistor 49, an inverter 51, an inverter 52, an inverter 53, and an inverter 54. Individual redundancy logic circuit 41 comprises an N channel transistor 56, an N channel transistor 57, an N channel transistor 58, an N channel transistor 59, a fusible link 61, a fusible link 62, a fusible link 63, a fusible 64, an N channel transistor 66, an inverter 67, and an inverter 68. Decoder/driver 39 comprises a P channel transistor 71, a P channel transistor 72, a P channel transistor 73, a P channel transistor 74, an N channel transistor 76, an N channel transistor 77, an N channel transistor 78, an N channel transistor 79, an inverter 81, and an inverter 82.

A description of how these circuit elements of circuit 36 are connected together now follows. Transistor 46 has a source connected to a negative power supply terminal which is ground, a gate for receiving a redundancy pulse which is generated in response to signal *RAS becoming active, and a drain. Fusible link 47 has a first terminal connected to the drain of transistor 46, and a second terminal connected to a positive power supply terminal VDD for receiving a positive power supply voltage of, for example, 5 volts. Transistor 48 has a first current electrode connected to the drain of transistor 46, a gate for receiving pulse RP, and a second current electrode. Transistor 48 is used to take advantage of the bilateral nature of insulated gate field effect transistors by which the function of source or drain can be on either current electrode terminal. Transistor 49 has a source connected to VDD, a gate for receiving a power-up clock *PUC, and a drain connected to the second current electrode of transistor 48. Inverter 51 has an output connected to the drain of transistor 49, and an input. Inverter 52 has an input connected to the drain of transistor 49, and an output connected to the input of inverter 51. Inverter 53 has an input connected to the output of inverter 52, and an output as a first output of control circuit 37. Inverter 54 has an input connected to the output of inverter 53, and an output for providing a second output of control circuit 37.

Transistor 56 has a first current electrode for receiving signal Z1, a control electrode connected to the output of inverter 54, and a second current electrode. Transistor 57 has a first current electrode for receiving signal Z2, a control electrode connected to the output of inverter 54, and a second current electrode. Transistor 58 has a first current electrode for receiving signal Z3, a control electrode connected to the output of inverter 54, and a second current electrode. Transistor 59 has a first current electrode for receiving signal Z4, a control electrode connected to the output of inverter 54, and a second current electrode. Fusible link 61 has a first terminal connected to the second current electrode of transistor 56, and a second current electrode connected to a node 86. Fusible link 62 has a first terminal connected to the second current electrode of transistor 57, and a second current electrode connected to node 86. Fusible link 63 has a first terminal connected to the second current electrode of transistor 58, and a second current electrode connected to node 86. Fusible link 64 has a first terminal connected to the second current electrode of transistor 59, and a second current electrode connected to node 86. Transistor 66 has a drain connected to node 86, a gate connected to the output of inverter 53, and a source connected to ground. Inverter 67 has an output connected to node 86, and an input. Inverter 68 has an input connected to node 86, and an output connected to the input of inverter 67. Node 86 is the point at which signal P1 is generated by programmable select circuit 41.

Transistor 71 has a gate connected to node 86 to receive signal P1, a source connected to VDD, and a drain connected to a node 87. Transistor 72 has a gate for receiving signal P2, a source connected to VDD, and a drain connected to node 87. Transistor 73 has a gate for receiving signal P3, a source connected to VDD, and a drain connected to node 87. Transistor 74 has a gate for receiving signal P4, a source connected to VDD, and a drain connected to node 87. Transistor 76 has a gate connected to node 86 to receive signal P1, a drain connected to node 87, and a source. Transistor 77 has a gate for receiving signal P2, a drain connected to the source of transistor 76, and a source. Transistor 78 has a gate for receiving signal P3, a drain connected to the source of transistor 77, and a source. Transistor 79 has a gate for receiving signal P4, a source connected to ground, and a drain connected to the source of transistor 78. Inverter 81 has an input connected to node 87, and an output. Inverter 82 has an input connected to the output of inverter 81, and an output for providing signal *RRE.

Each of programmable select circuits 42, 43, and 44 are constructed in the same way as programmable select circuit 41. Each has four fusible links associated with a particular predecoded signal. For circuit 41, fusible link 61 is associated with predecoded signal Z1, fusible link 62 is associated with signal Z2, fusible link 63 is associated with signal Z3, and fusible link 64 is associated with signal Z4. Each row in the array has associated with it four predecoded signals, one each from the four groups of predecoded signals. In the case in which the row associated with circuit 36 is to replace a defective row in array 11, the fusible links in circuits 41-44 which are associated with the predecoded signals which are associated with the defective row are not blown but the other three fusible links in each of circuits 41-44 are blown. Assume, for example, that the defective row had signals Z2, Z6, Z10, and Z14 associated with it. In the case of circuit 41, fusible links 61, 63, and 64 would be blown. Fusible link 62, because it is associated with the same predecoded signal as the defective row, would not be blown. In circuit 42 the fusible links associated with signals Z5, Z7, and Z8 would be blown. In circuit 43 the fusible links associated with signals Z9, Z11, and Z12 would be blown. In circuit 44 the fusible links associated with signals Z13, Z15, and Z16 would be blown.

Fusible link 47 is also blown to implement the redundant row associated with circuit 37. Inverters 51 and 52 form a latch 88. Latch 88 stores information as to whether or not circuit 37 is implementing redundancy. At power-up of memory 10, signal *PUC is a logic low pulse which couples a logic high to the input of inverter 52 via transistor 49. Latch 88 retains this condition of a logic high on the input of inverter 52 and thus a logic low on the output of inverter 52 after signal *PUC switches to a logic high. Signal *PUC is at a logic low for a predetermined time duration following power-up but is a logic high thereafter. Upon the first active cycle when signal *RAS becomes active, pulse RP switches to a logic high for a short duration. If fuse 47 is blown, pulse RP pulsing to a logic high causes the drain of transistor to be at ground potential which is coupled to the input of inverter 52 via transistor 48. This causes latch 88 to be toggled to provide a logic output to inverter 53. If fusible link 47 is not blown, pulse RP switching to a logic high will not cause the drain of transistor 46 to reach ground potential. The drain of transistor 46 will remain at essentially VDD even though transistor 46 becomes conductive. Fusible link 47 is very low resistance and transistor 46 is relatively small size so there is not excessive current drain. With the drain of transistor 48 a logic high, transistor 48 simply couples a logic high to latch 88 which should have the input of inverter 52 already latched at a logic high. In the event something unexpected happens to cause latch 88 to toggle, the occurence of pulse RP will set latch 88 to provide a logic low output to inverter 53. Thus if fusible link 47 is not blown, upon each active cycle there will be provided reinforcement of the logic low output of latch 88 to inverter 53. For DRAMs there is a specified warm-up requirement to ensure that all nodes in the memory are charged to the proper state. No data should be attempted to be written or read until the warm-up requirement has been met. A typical warm-up requirement is eight cycles. Thus it is ensured that the state of latch 88 properly reflects whether or not fusible link 47 has been blown. If fusible link 47 has been blown, latch 88 provides a logic high output to inverter 53 in which case inverter 53 provides a logic low output and inverter 54 provides a logic high output. If fusible link 47 has not been blown, latch 88 provides logic low output to inverter 53 in which case inverter 53 provides a logic high output and inverter 54 provides a logic low output.

The outputs of inverters 53 and 54 are thus controlled by the state of latch 88. The outputs of inverters 53 and 54 are used to control the implementation of circuit 37. When circuit 37 is to be implemented in redundancy, the output of inverter 53 is a logic low and the output of iverter 54 is a logic high which causes transistor 66 to be non-conductive and transistors 56-59 to be conductive. The one fusible link of fusible links 61-64 which is not blown will couple the predecoded signal of predecoded signals Z1-Z4 with which it is associated to node 86. Inverters 67 and 68 form a latch 89 which latches the signal coupled to node 86. This latched signal at node 86 forms the signal P1 output of circuit 41. Similarly for circuits 42-44, the output of inverter 54 at a logic high allows the predecoded signals of predecoded signals Z5-Z16 associated with the unblown fusible links to be latched and output as signals P2-P4. In such case, the redundant row associated with circuit 37 is selected when all of signals P1-P4 are a logic high.

Decoder/driver 39 is comprised of a four input NAND gate 91 as the decoder and two inverters as a driver 92. Four input NAND gate 91 is comprised of N channel transistors 76-79 and P channel transistors 71-74. Driver 92 is comprised of inverters 81 and 82. When all of signals P1-P4 are a logic high, transistors 76-79 will all be conductive causing node 87 to be a logic low. Inverters 81 and 82 then provide signal *RRE at a logic low whch is the active state for signal *RRE. This causes the selection of the redundant row associated with circuit 37. Any other combination of logic states for signals P1-P4 will cause at least one of transistors 76-79 to be non-conductive and at least one of transistors 71-74 to be conductive so that node 87 will be at a logic high, causing driver 92 to provide signal *RRE at a logic high, its inactive state. Signal *RRE can also be used to disable the defective row because signal *RRE can be generated faster than a normal row select signal generated by row decoder 12. Circuit 37 does not have as stringent size constraints as does the plurality of logic decoders which comprise row decoder 12 because of the relatively small number of redundant rows. Thus circuit 37 can be made faster than the row logic decoders without having any impact of consequence on the overall chip size of memory 10.

Signals Z1-Z16 are multiplexed so that signals P1-P4 will be responsive to not only the row address but also the column address. Consequently, signal *RRE is responsive to the row address and the column address. The redundant row associated with circuit 37 also includes a row driver which latches the state of signal *RRE during the row address but is not responsive to the column address. This type of row driver is conventional.

A circuit similar to circuit 37 can be used to implement a redundant column. In the case of a redundant column, it is necessary to not respond to the row address. This can be handled by conventional means. Instead of connecting the source of transistor 79 to ground, the source of transistor would be clocked. During the row address the path to ground via transistors 76-79 would be blocked so that node 87 would remain at a logic high during the row address. During the column address, the source of transistor would be coupled to ground so that the logic state of node 87 would be dependent on the logic states of signals P1-P4. This type of decoupling of the column decoder logic gate during the row address is well known.

For the case in which redundancy is not implemented by circuit 37, the output of inverter 53 is a logic high and the output of inverter 54 is a logic low. The logic high output of inverter 53 causes transistor 66 to be conductive and thus force node 86 to a logic low. The logic low output of inverter 54 causes transistors 56-59 to be non-conductive so that signals Z1-Z4 are decoupled from node 86. With node 86 held to a logic low by transistor 66 and signals Z1-Z4 decoupled from node 86, signal P1 will always be a logic low. Similarly for circuits 42-44, the logic high output of inverter 53 and the logic low output of inverter 54 ensure that signals P2-P4 will all be a logic low. This then ensures that node 87 will be at a logic high which in turn ensures that signal *RRE will not be active. Thus the redundant row associated with circuit 37 cannot be selected.

Figure 4:
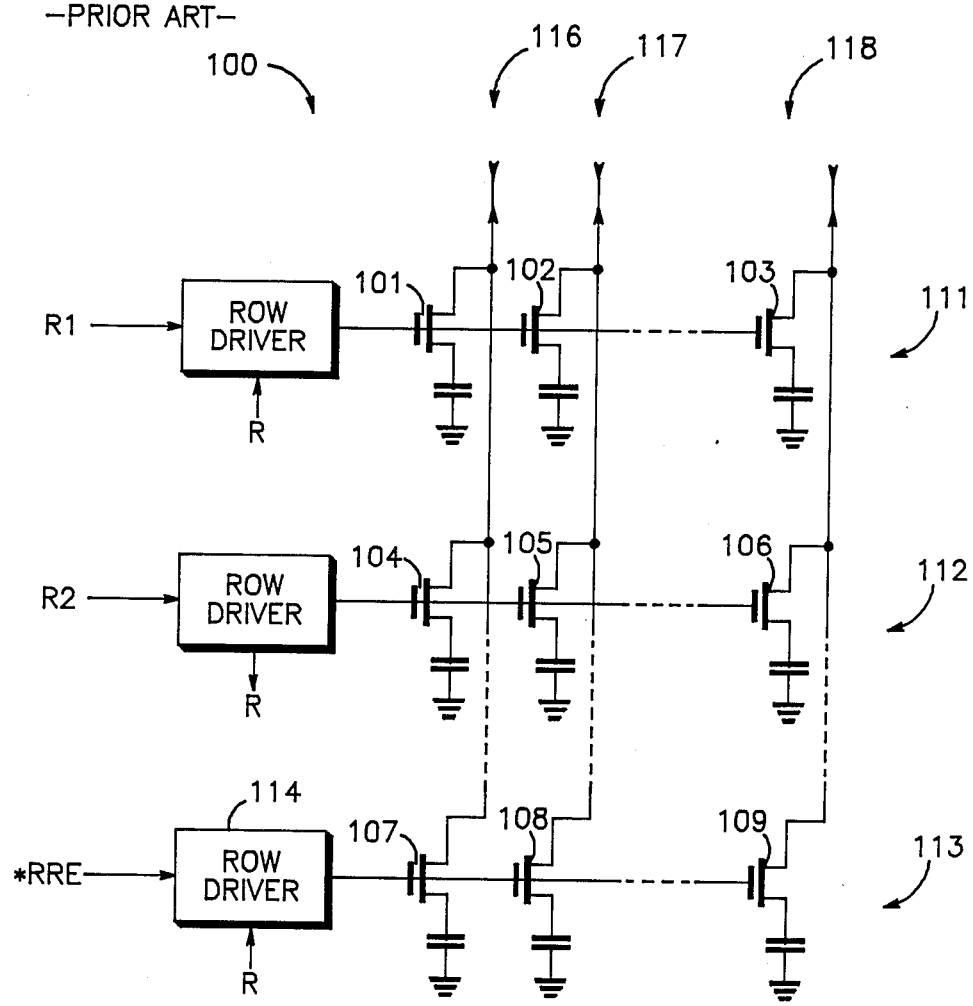
FIG. 4 is a circuit diagram of a portion of a memory array of the prior art.

Shown in FIG. 4 is a portion 100 of a conventional DRAM array having rows and columns. Shown are DRAM cells 101, 102, 103, 104, 105, 106, 107, 108, and 109. Cells 101, 102, and 103 are part of a row 111. Cells 104, 105, and 106 are part of a row 112. Cells 107, 108, and 109 are part of a row 113. The cells along each row are enabled by a row driver which is clocked by a row address signal R. Row 113 could be considered the redundant row associated with circuit 37 of FIG. 3 in which case it would receive signal *RRE at a row driver 114 as shown in FIG. 4. Signal *RRE provides the information as to whether or not row 113 is to be selected and signal R provides the information as to when signal *RRE is to be interpreted. This type of procedure is well known in DRAMs. Cells 101, 104, and 107 form a oolumn 116. Cells 102, 105, and 108 form a column 117. Cells 103, 106, and 109 form a column 118. A selected column either provides data to or receives data from a cell in that column. The particular cell is the one which is also in the row which was selected.

Both a row and column is characterized as a line of memory cells. Along one of these all of the cells are enabled. Along the other, the enabled cell is read or written. In typical usage, the row is the line of cells which are enabled and the column is for writing and reading. In the case of the reading and writing the actual selection is made by coupling either a sensing circuit or a writing circuit to the selected line of cells. In the case of enabling, the selected line of cells receives a signal which enables all of the cells along that line of cells. Consequently, there is a difference in how columns and rows are treated. The selection process, for a row or column, however, is virtually the same. An address is decoded and a selection signal is generated which is then used to select a read/write coupling mechanism or to select a driver-type enabling mechanism.

The technique for redundancy shown in FIGS. 1-3 is thus applicable to any line of memory cells, whether row or column because it is directed to how the select signal is generated not to whether it is for coupling a read or write circuit to a column or a driver circuit to a row.

The use of predecoded signals to drive the redundancy decoder allows the address buffers to be faster because there is less load on them than for the case in which the redundancy decoder is is driven directly from the outputs of the address buffers. This also allows the predecoders to be closer to the address buffers while allowing flexibility as to the placement of the redundancy decoders. The additional loading of the redundancy decoders on the predecoders is insignificant because there is already a very large load on the predecoder outputs. The predecoder outputs traverse most of chip to a large number of inputs so the capacitive loading is already very severe. The output drive requirements on the predecoders is thus already very large so that the additional loading of the redundancy decoders does not actually affect this drive requirement on the predecoder output circuits. Because the redundant decoder does not need to be placed near the address buffers, the redundant decoder can be placed near the redundant line of memory cells. This reduces the amount of capacitance on the output of the redundant decoder which is advantageous. Although shown for a DRAM, the approach is applicable to other memories. The circuits may require some modifications depending upon the particular type of memory. In a memory which uses address transition detection to initiate a new data cycle, for example, signal RP could be replaced by a signal generated by the address transition detector.

We claim:

1. A memory having a main array of first-type lines and second-type lines with memory cells located at said intersections, whereby a memory cell is selected by selecting a first-type line and a second-type line, comprising:
   buffer means for receiving a first address for providing information for selecting a first-type and a second address for providing information for selecting a second-type line;
   predecoder means, coupled to the buffer means, for performing a predecode on the first address and providing predecode signals representative of said predecode;
   first normal decoder means, coupled to the predecoder means, for selecting a first-type line from the main array in response to the predecode signals; and
   programmable redundant decoder means, coupled to the output of the predecoder means, for being programmed to select the redundant first-type line in response to the predecoder signals which select the defective first-type line, wherein the programmable redundant decoder means comprises: logic decoder means having a plurality of inputs, for enabling the redundant first-type line when the plurality of inputs are all at a first logic state; a plurality of coupling transistors, each coupling transistor having a first current electrode for receiving a respective decode signal, a control electrode for receiving a control signal, and a second control signal; and a plurality of fusible links divided into sets of fusible links, said sets of fusible links corresponding to respective inputs of the logic decoder means, each fusible link having a first terminal coupled to the second current electrode of a respective coupling transistor, and a second terminal connected to the input of the logic decoder which corresponds to the set of which it is a member.

2. The memory of claim 1, wherein the memory is further characterized as having an active cycle during which said first-type and second type-lines are selected, said active cycle initiated by a first clock signal, and the programmable redundant decoder means is further characterized as being enabled by a control signal, further comprising:
   programmable redundant control means for providing the control signal in response to the first clock signal when said programmable redundant control means has been programmed.

3. The memory of claim 2, wherein the programmable redundant control means comprises:
   a first N channel transistor having a control electrode coupled to the first clock signal, a first current electrode coupled to a first power supply terminal, and a second current electrode;
   a fusible link having a first terminal coupled to the second current elctrode of the first N channel transistor, and a second current electrode coupled to a second power supply terminal;
   a second N channel transistor having a first current electrode coupled to the second current electrode of the first transistor, a control electrode coupled to the control electrode of the first transistor, and a second current electrode;
   a third P channel transistor having a first current electrode coupled to the second current electrode of the second transistor, a control electrode for receiving a power-up signal, and a second current electrode coupled to the second power supply terminal;
   a first latch having an input coupled to the first current electrode of the third transistor, and an output for providing the control signal.

4. The memory of claim 3 wherein the latch comprises: a first inverter having an input coupled to the first current electrode of the third transistor, and an output;
   a second inverter having an input coupled to the output of the first inverter, and an output coupled to the input of the second inverter;
   a third inverter having an input coupled to the output of the first inverter, and an output; and
   a fourth inverter having an input coupled to the output of the third inverter, and an output for providing the control signal.

5. A memory having a main array of intersecting first-type lines and second-type lines with memory cells located at said intersections and having an active cycle during which said first-type lines and second-type lines are selected, said active cycle initiated by a first clock signal, whereby a memory cell is selected by selecting a first-type line and a second-type line, comprising:
   buffer means for receiving a first address for providing information for selecting a first-type line and a second address for providing information for selecting a second-type line;

predecoder means, coupled to the buffer means, for performing a predecode on the first address and providing predecode signals representative of said predecode;

first normal decoder means, coupled to the predecoder means, for selecting a first-type line from the main array in response to the predecode signals;

programmable redundant decoder means, coupled to the output of the predecoder means, for being programmed to select the redundant first-type line in response to the predecoder signals which select the defective first-type line, and being enabled by a control signal; and programmable redundant control means for providing the control signal in response to the first clock signal when said programmable redundant control means has been programmed.

6. The memory of claim 5, wherein the programmable redundant control means comprises:

a first N channel transistor having a control electrode coupled to the first clock signal, a first current electrode coupled to a first power supply terminal, and a second current electrode;

a fusible link having a first terminal coupled to the second current elctrode of the first N channel transistor, and a second current electrode coupled to a second power supply terminal;

a second N channel transistor having a first current electrode coupled to the second current electrode of the first transistor, a control electrode coupled to the control electrode of the first transistor, and a second current electrode;

a third P channel transistor having a first current electrode coupled to the second current electrode of the second transistor, a control electrode for receiving a power-up signal, and a second current electrode coupled to the second power supply terminal;

a first latch having an input coupled to the first current electrode of the third transistor, and an output for providing the control signal.

7. The memory of claim 6 wherein the first latch comprises:

a first inverter having an input coupled to the first current electrode of the third transistor, and an output;

a second inverter having an input coupled to the output of the first inverter, and an output coupled to the input of the second inverter;

a third inverter having an input coupled to the output of the first inverter, and an output; and a fourth inverter having an input coupled to the output of the third inverter, and an output for providing the control signal.

8. A memory having a main array of intersecting first-type lines and a second-type lines with memory cells located at said intersections, whereby a memory cell is selected by selecting a first-type line and second-type line, said memory having an active cycle during which said first-type lines and second-type lines are selected, said active cycle initiated by a first clock signal, comprising:

input means for receiving the first address and providing an output with respect thereto;

first normal decoder means, coupled to the input means, for selecting a first-type line from the main array in response to the first address;

a redundant first-type line for replacing a defective first-type line in the main array;

programmable redundant decoder means, coupled to the output of the input means, for being programmed to select the redundant first-type line in response to the first address which selects the defective first-type line when said programmable decoder means has received a control signal; and programmable redundant control means for providing the control signal in response to the first clock signal when said programmable redundant control means has been programmed.

9. The memory of claim 8, wherein the programmable redundant control means comprises:

a first N channel transistor having a control electrode coupled to the first clock signal, a first current electrode coupled to a first power supply terminal, and a second current electrode;

a fusible link having a first terminal coupled to the second current electrode of the first N channel transistor, and a second current electrode coupled to a second power supply terminal;

a second N channel transistor having a first current electrode coupled to the second current electrode of the first transistor, a control electrode coupled to the control electrode of the first transistor, and a second current electrode;

a third P channel transistor having a first current electrode coupled to the second current electrode of the second transistor, a control electrode for receiving a power-up signal, and a second current electrode coupled to the second power supply terminal;

a first latch having an input coupled to the first current electrode of the third transistor, and an output for providing the control signal.

10. The memory of claim 9 wherein the latch comprises: a first inverter having an input coupled to the first current electrode of the third transistor, and an output;

a second inverter having an input coupled to the output of the first inverter, and an output coupled to the input of the second inverter;

a third inverter having an input coupled to the output of the first inverter, and an output; and a fourth inverter having an input coupled to the output of the third inverter, and an output for providing the control signal.

11. A memory having a main array of intersecting first-type lines and second-type lines with memory cells located at said intersections, whereby a memory cell is selected by selecting a first-type line in response to a first address and a seocnd type-line in response to a second address, comprising:

means for receiving the first address and providing decoder signals with respect thereto;

first normal decoder means, coupled to the means for receiving the first address, for selecting a first-type line from the main array in response to the decoder signals;

a redundant first-type line for replacing a defective first-type line in the main array, logic decoder means having a plurality of inputs, for enabling the redundant first-type line when the plurality of inputs are all at a first logic state;

a plurality of coupling transistors, each coupling transistor having a first current electrode for receiving a respective decoder signal, a control electrode for receiving a control signal, and a second control signal; and a plurality of fusible links divided into sets of fusible links, said sets of fusible links corresponding to respective inputs of the logic decoder, each fusible link having a first terminal coupled to the second current electrode of a respective coupling transistor, and a second terminal connected to the input of the logic decoder which corresponds to the set of which it is a member;

whereby the inputs of the logic decoder are decoupled from the decoder signals by the coupling transistor when the control signal is not present and the fusible links can be selectively blown so that only selected decoder signals are coupled to the logic decoder when the control signal is present.

12. The memory of claim 11, wherein the memory is further characterized as having an active cycle during which said first-type and second type-lines are selected, said active cycle initiated by a first clock signal, and the programmable decoder means is further characterized as being enabled by a control signal, further comprising: programmable redundant control means for providing the control signal in response to the first clock signal when said programmable redundant control means has been programmed.

13. The memory of claim 12, wherein the programmable redundant control means comprises:

a first N channel transistor having a control electrode coupled to the first clock signal, a first current electrode coupled to a first power supply terminal, and a second current electrode;

a fusible link having a first terminal coupled to the second current electrode of the first N channel transistor, and a second current electrode coupled to a second power supply terminal;

a second N channel transistor having a first current electrode coupled to the second current electrode of the first transistor, a control electrode coupled to the control electrode of the first transistor, and a second current electrode;

a third P channel transistor having a first current electrode coupled to the second current electrode of the second transistor, a control electrode for receiving a power-up signal, and a second current electrode coupled to the second power supply terminal;

a first latch having an input coupled to the first current electrode of the third transistor, and an output for providing the control signal.

14. The memory of claim 13 wherein the latch comprises:

a first inverter having an input coupled to the first current electrode of the third transistor, and an output;

a second inverter having an input coupled to the output of the first inverter, and an output coupled to the input of the second inverter;

a third inverter having an input coupled to the output of the first inverter, and an output; and a fourth inverter having an input coupled to the output of the third inverter, and an output for providing the control signal.

* * * * *